(12) United States Patent
Lee et al.

(10) Patent No.: US 7,643,339 B2
(45) Date of Patent: Jan. 5, 2010

(54) MULTI-BIT FLASH MEMORY DEVICES HAVING A SINGLE LATCH STRUCTURE AND RELATED PROGRAMMING METHODS, SYSTEMS AND MEMORY CARDS

(75) Inventors: Ho-kil Lee, Gyeonggi-Do (KR); Jin-Yup Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 195 days.

(21) Appl. No.: 11/801,792

(22) Filed: May 11, 2007

(65) Prior Publication Data

US 2007/0268748 A1 Nov. 22, 2007

(30) Foreign Application Priority Data

May 18, 2006 (KR) .............. 10-2006-0044883

(51) Int. Cl.
*G11C 16/04* (2006.01)
(52) U.S. Cl. .............. 365/185.03; 365/96; 365/185.21; 365/185.08; 365/185.18; 365/185.19
(58) Field of Classification Search .............. 365/96, 365/185.21, 185.03, 185.08, 185.18, 185.19
See application file for complete search history.

(56) References Cited

U.S. PATENT DOCUMENTS

| 5,473,563 | A | 12/1995 | Suh et al. |
| 5,768,188 | A | 6/1998 | Park et al. |
| 5,862,074 | A | 1/1999 | Park |
| 5,930,172 | A | 7/1999 | Kucera |
| 5,966,326 | A | 10/1999 | Park et al. |
| 5,982,663 | A | 11/1999 | Park |
| 6,266,273 | B1 * | 7/2001 | Conley et al. .......... 365/185.11 |
| 6,278,636 | B1 | 8/2001 | Lee |
| 6,288,935 | B1 | 9/2001 | Shibata et al. |
| 6,496,412 | B1 | 12/2002 | Shibata et al. |

(Continued)

FOREIGN PATENT DOCUMENTS

EP 1280161 A1 1/2003

(Continued)

OTHER PUBLICATIONS

Notice to File a Response in Korean Application No. 10-2006-0044833; date of mailing Nov. 4, 2006.

(Continued)

*Primary Examiner*—Connie C Yoha
(74) *Attorney, Agent, or Firm*—Myers Bigel Sibley & Sajovec

(57) ABSTRACT

A multi-bit non-volatile memory device is provided. The memory device includes a memory cell array including a plurality of memory cells. A page buffer is electrically coupled to the memory cell array. The page buffer includes a plurality of latches configured to store a first bit of multi-bit data to be written into or read out from one of the plurality of memory cells of the memory cell array. A buffer random access memory (RAM) is electrically coupled to the page buffer. The buffer RAM is configured to store a second bit of the multi-bit data to be written into or read out from one of the plurality of memory cells of the memory cell array. Related systems, memory cards and methods are also provided.

30 Claims, 17 Drawing Sheets

U.S. PATENT DOCUMENTS

| | | |
|---|---|---|
| 6,522,580 B2 | 2/2003 | Chen et al. |
| 6,813,184 B2 | 11/2004 | Lee |
| 6,965,964 B2 * | 11/2005 | Lee et al. ............... 711/103 |
| 7,023,737 B1 | 4/2006 | Wan et al. |
| 7,035,144 B2 | 4/2006 | Kim et al. |
| 7,457,157 B2 * | 11/2008 | Kim ................ 365/185.03 |
| 2003/0016559 A1 | 1/2003 | Kawai et al. |
| 2004/0221092 A1 | 11/2004 | Lee |
| 2005/0162929 A1 | 7/2005 | Shiota et al. |
| 2005/0276107 A1 * | 12/2005 | Shiga et al. ............ 365/185.17 |
| 2006/0164885 A1 | 7/2006 | Yang et al. |
| 2006/0181924 A1 | 8/2006 | Cha |
| 2006/0221685 A1 | 10/2006 | Yamada et al. |
| 2007/0124558 A1 * | 5/2007 | Lee et al. ............... 711/167 |

FOREIGN PATENT DOCUMENTS

| | | |
|---|---|---|
| EP | 1326257 A2 | 7/2003 |
| EP | 1326257 A3 | 8/2006 |
| JP | 11-144479 A | 5/1999 |
| JP | 2001-093288 | 4/2001 |
| JP | 2003-233529 A | 8/2003 |
| JP | 10-2003-0047171 | 1/2005 |
| JP | 2005-032431 | 2/2005 |
| KR | 10-1999-0057216 A | 7/1999 |
| KR | 1020010068554 A | 7/2001 |
| KR | 1020010070086 A | 7/2001 |
| KR | 1020020057055 A | 7/2002 |
| KR | 1020030002730 A | 1/2003 |
| KR | 1020040098642 A | 11/2004 |
| KR | 1020050007653 A | 1/2005 |
| KR | 10-2005-0059249 A | 6/2005 |
| KR | 1020050068554 A | 7/2005 |
| KR | 1020050069218 A | 7/2005 |
| KR | 1020050087264 A | 8/2005 |
| KR | 1020060024149 A | 3/2006 |
| KR | 1020060056236 A | 5/2006 |
| WO | WO 97/50090 | 12/1997 |
| WO | WO98/01861 A1 | 1/1998 |

OTHER PUBLICATIONS

English translation of Notice to File a Response in Korean Application No. 10-2006-0044833; date of mailing Nov. 4, 2006.

European Search Report, Reference: P47895 EP; Application No./Patent No. 07016055.1-1233/1892721.

European Search Report, Application No. 07016257.3, Sep. 23, 2008.

* cited by examiner

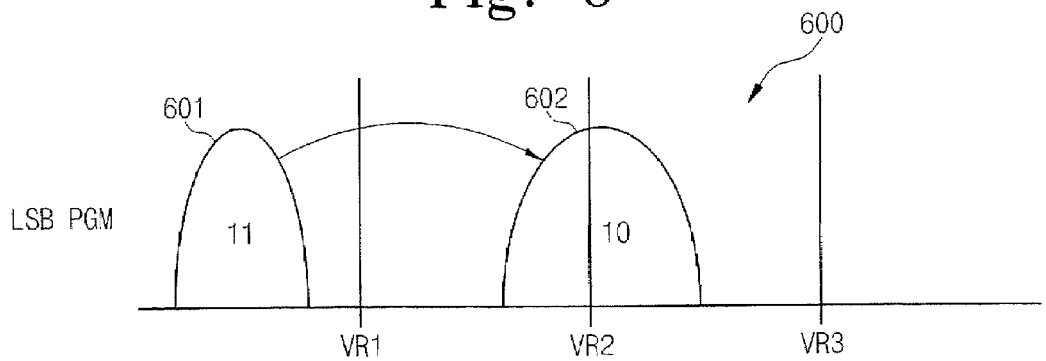
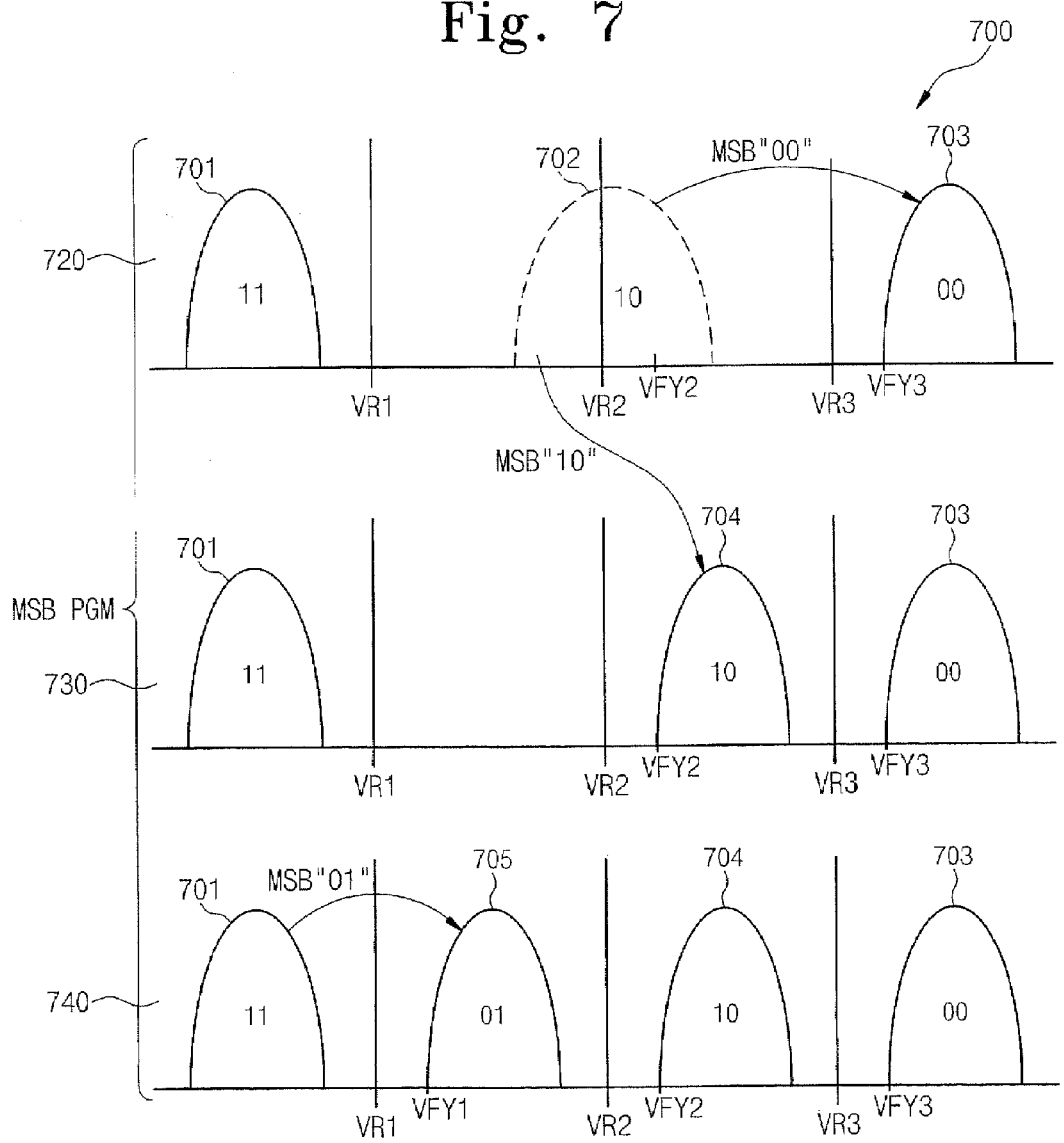

Fig. 10
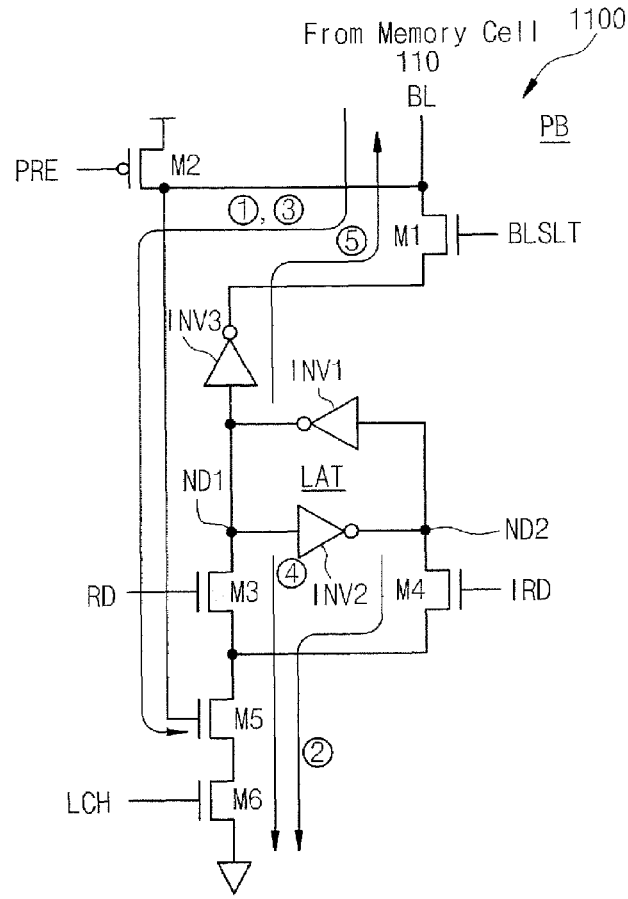
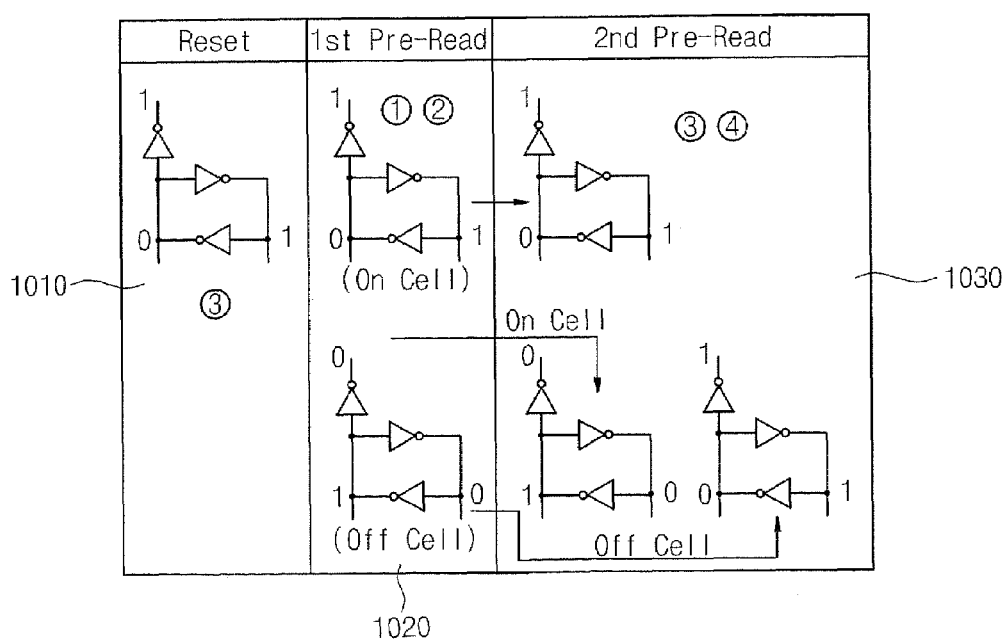

Fig. 15
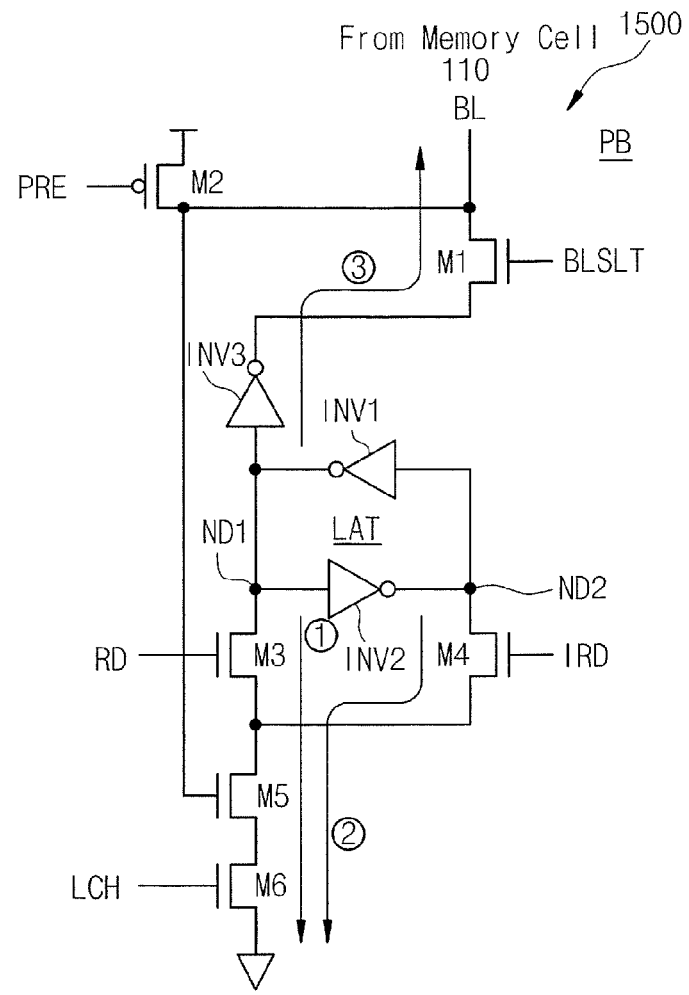
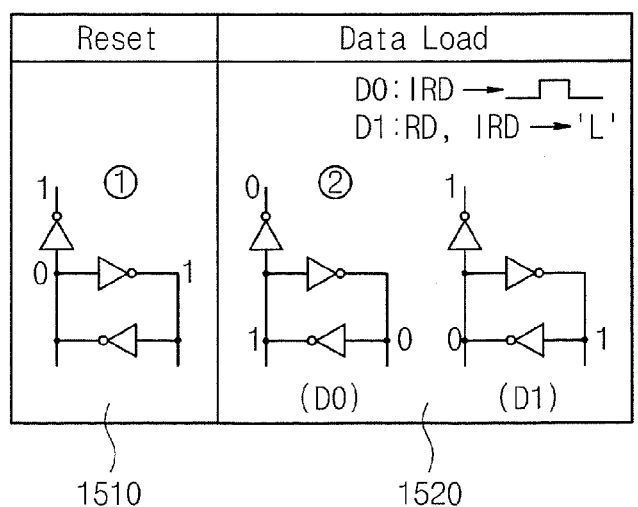

MULTI-BIT FLASH MEMORY DEVICES HAVING A SINGLE LATCH STRUCTURE AND RELATED PROGRAMMING METHODS, SYSTEMS AND MEMORY CARDS

CROSS-REFERENCE TO RELATED APPLICATION

This application claims the benefit of Korean Patent Application No. 2006-0044833, filed May 18, 2006, the disclosure of which is hereby incorporated herein by reference in its entirety.

FIELD OF THE INVENTION

The present invention generally relates to non-volatile memory devices and, more particularly, to multi-bit non-volatile memory devices and related methods, systems and memory cards.

BACKGROUND OF THE INVENTION

The demand for non-volatile semiconductor memory devices has significantly increased because data stored in the non-volatile memory device may not be erased when power is removed from the device. Flash memory devices may be used as non-volatile memory devices. In these devices, memory cells may be provided by a single transistor. Thus, memory devices including flash memory may be relatively smaller than other memory devices. Therefore, flash memory may be used instead of, for example, magnetic disks, for storing large amounts of data. Details with respect to conventional non-volatile semiconductor memory devices are discussed in U.S. Pat. No. 5,751,634 (the '634 patent) entitled NON-VOLATILE SEMICONDUCTOR MEMORY DEVICE FOR STORING MULTIVALUE DATA AND READOUT/WRITE-IN METHOD THEREFOR to Itoh, the disclosure of which is incorporated herein by reference as if set forth in its entirety.

In particular, the '634 patent discusses a flash memory device including memory cells for storing 2-bit data connected to a bit line. As discussed therein, first and second flip-flop circuits are coupled to the bit line. The first flip-flop circuit stores the lower bit (least significant bit (LSB)) of 2-bit data read out from or written into the memory cell. Similarly, the second flip-flop circuit stores the upper bit (most significant bit (MSB)) of 2-bit data read out from or written into the memory cell. Thus, during a data read operation, the MSB bit is read out of the memory cell first and then the LSB is read out from the memory cell. Similarly, during a data write operation, the MSB bit is written first into the memory cell and then the LSB is written into the memory cell.

Thus, the non-volatile semiconductor memory devices discussed in the '634 patent may provide a memory device having a large capacity, but capable of being manufactured at a low cost without using a difficult patterning technique or developing a new manufacturing technique. However, improved memory devices may still be desired.

SUMMARY OF EMBODIMENTS OF THE PRESENT INVENTION

Some embodiments of the present invention provide a multi-bit non-volatile memory device. The memory device includes a memory cell array including a plurality of memory cells. A page buffer is electrically coupled to the memory cell array. The page buffer includes a plurality of latches configured to store a first bit of multi-bit data to be written into or read out from one of the plurality of memory cells of the memory cell array. A buffer random access memory (RAM) is electrically coupled to the page buffer. The buffer RAM is configured to store a second bit of the multi-bit data to be written into or read out from one of the plurality of memory cells of the memory cell array.

In further embodiments of the present invention, the page buffer may include a plurality of single latches. Each of the single latches may be configured to store a least significant bit (LSB) of the 2-bit data. The buffer RAM may be configured to store a most significant bit (MSB) of the 2-bit data.

In still further embodiments of the present invention, the page buffer may include a plurality of single latches being configured to store intermediate program data. The program data may include MSB intermediate program data and wherein final MSB data is stored in the buffer RAM.

In some embodiments of the present invention, the multi-bit data may include 4-bit data, the page buffer may be further configured to store first through third LSBs of the 4-bit data and the buffer RAM may be further configured to store a MSB of the 4-bit data.

In still further embodiments of the present invention, the buffer RAM may include static RAM (SRAM) or dynamic RAM (DRAM). In certain embodiments of the present invention, an interface between the memory device and an external device may be a NOR interface. The memory cell array may include a NAND cell array.

In some embodiments of the present invention, the buffer RAM may be configured to reload the second bit of the multi-bit data into one of the plurality of memory cells through the page buffer.

Although embodiments of the present invention are discussed above primarily with respect to memory devices, systems, memory cards and methods are also provided herein.

BRIEF DESCRIPTION OF THE DRAWINGS

FIG. 6 is a diagram illustrating an LSB program according to some embodiments of the present invention.

FIG. 7 is a diagram illustrating MSB programs according to some embodiments of the present invention.

FIG. 10 is a schematic diagram illustrating operations of a page buffer during an MSB "10" program according to some embodiments of the present invention.

FIG. 15 is a schematic diagram illustrating page buffer operations during an LSB program according to some embodiments of the present invention.

DETAILED DESCRIPTION OF EMBODIMENTS OF THE INVENTION

Figure 1:
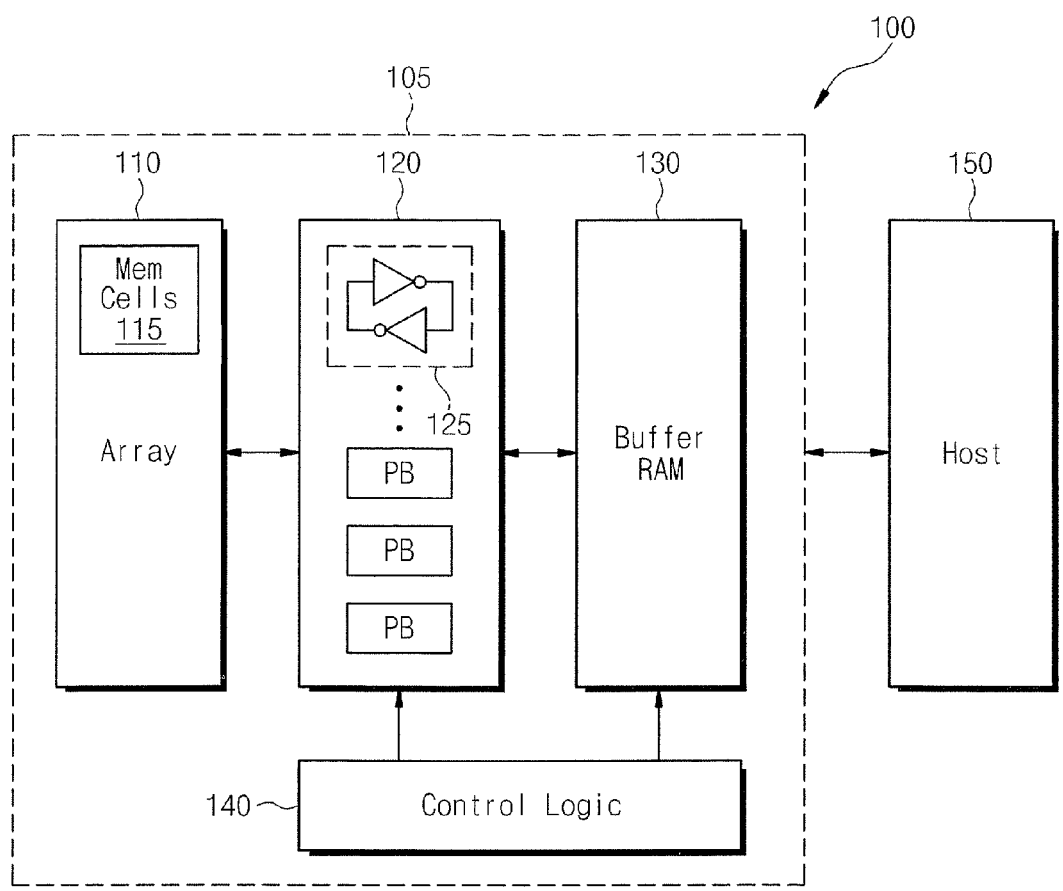
FIG. 1 is a block diagram of a multi-bit flash memory system according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, component or section. Thus, a first element, component or section discussed below could be termed a second element, component or section without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As will be discussed below with respect to FIGS. 1 through 19, some embodiments of the present invention provide improved non-volatile memory devices and related systems, methods and memory cards. In particular, some embodiments of the present invention provide multi-bit non-volatile memory devices including a page buffer having a single latch structure, i.e., the page buffer includes a plurality of single latches. The single latch structure is configured to store a first bit of multi-bit data, for example, a least significant bit (LSB) of multi-bit data and to store intermediate data during the programming process. Memory devices according to some embodiments of the present invention also include a buffer random access memory (RAM). A second bit of multi-bit data, for example, a most significant bit (MSB) of the multi-bit data is stored in the buffer RAM. The combination of the single latch page buffer and the buffer RAM according to some embodiments of the present invention may enable smaller devices to be manufactured as the combination structure occupies less space in the memory device than the conventional double latch structure. Furthermore, memory devices according to some embodiments of the present invention may also provide improved performance as will be discussed below with respect to FIGS. 1 through 19.

Referring first to FIG. 1, a multi-bit flash memory system 100 according to some embodiments of the present invention will be discussed. As illustrated in FIG. 1, the system 100 includes a multi-bit flash memory device 105 coupled to an external host device 150. In some embodiments of the present invention, the interface between the flash memory device 105 and the external host device 150 may be a NOR interface. It will be understood that the flash memory device 105 can be any flash memory device capable of operating as discussed herein. For example, in some embodiments of the present invention, the flash memory device could be a NAND or a NOR flash memory device without departing from the scope of the present invention.

As further illustrated in FIG. 1, the flash memory device 105 includes a memory cell array 110, a page buffer 120, a buffer RAM 130 and control logic 140. The memory cell array 110 may include one or more memory cells 115. In some embodiments of the present invention, the memory cell array 110 may include a string cell of NAND flash memory. In some embodiments of the present invention, the flash memory device 105 may be a OneNAND flash memory device. The OneNAND flash memory device includes a NAND cell array and a NOR interface between the flash memory device 105 and the host 150.

The page buffer 120 is electrically coupled to the memory cell array 110 and the buffer RAM 130 as illustrated in FIG. 1. The page buffer 120 includes one or more single latches 125, which are configured to store a first bit of multi-bit data to be written into or read out from one of the memory cells 115 of the memory cell array 110. In some embodiments of the present invention, the first bit of multi-bit data may be the least significant bit (LSB) of multi-bit data. The page buffer 120 is also configured store intermediate program data during the programming operation (write operation) as will be further discussed below. Thus, the page buffer 120 according to some embodiments of the present invention may operate as a driver during a write (program) operation and as a sense amplifier during a read operation.

As further illustrated in FIG. 1, the buffer RAM 130 is electrically coupled to the page buffer 120. The buffer RAM 130 is configured to store a second bit of the multi-bit data to be written into or read out from one of the memory cells 115 of the memory cell array 110. In some embodiments of the present invention, the second bit of multi-bit data is the most significant bit (MSB) of multi-bit data. In some embodiments of the present invention, the program data may include MSB intermediate program (write) data as will be discussed further below. In some embodiments of the present invention, the buffer RAM 130 may include static RAM (SRAM) or dynamic RAM (DRAM).

As discussed above, the buffer RAM occupies significantly less space than the latches of the page buffer. Therefore, by only including a page buffer 120 having single latches, rather than the conventional double latch, some embodiments of the present invention may provide a more compact and integrated memory device. Thus, memory devices according to some embodiments of the present invention may be suitable for use in small portable devices, such as mobile terminals and the like.

The control logic block 140 contains the control signals configured to begin and end a programming (write) operation and/or a read operation. For example, the buffer RAM 130 may be configured to temporarily store data from the memory cell array 110 through the page buffer 120 in response to a control signal generated by the control logic block 140. Operations of control logic blocks are known to those having skill in the art and will not be discussed in further detail herein in the interest of brevity.

Figure 19:
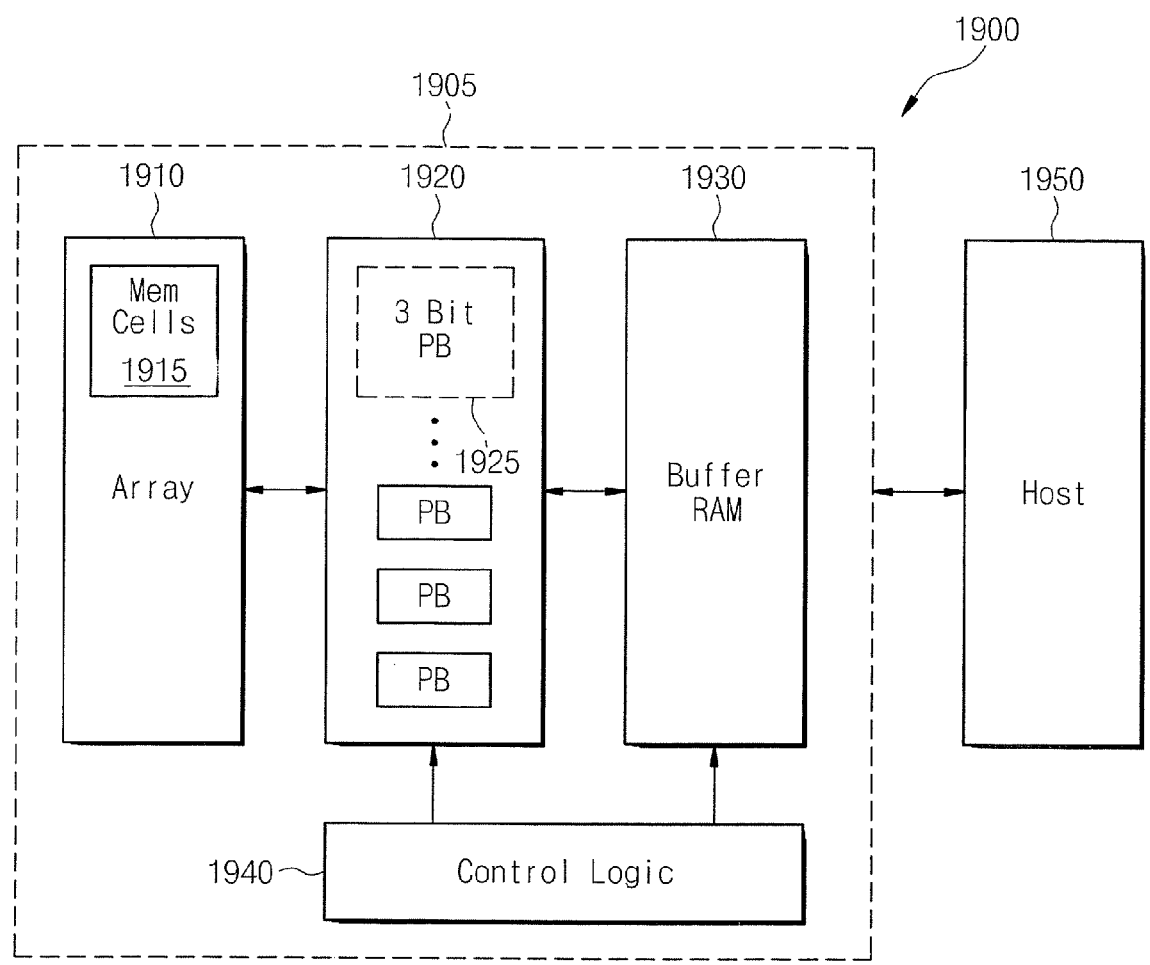
FIG. 19 is a block diagram of a multi-bit flash memory system according to some embodiments of the present invention.

Although embodiments of the present invention are discussed above with respect to a two bit multi-bit data having an MSB and an LSB and a page buffer configured to store a first bit of multi-bit data (LSB), embodiments of the present invention are not limited to this configuration. The page buffer may be configured to store more than a single bit of multi-bit data. For example, as illustrated in FIG. 19, some embodiments of the present invention may include four bit multi-bit data, where the page buffer 1920 is configured to store the three least significant bits of the four bit multi-bit data and the MSB of the four bit multi-bit data may be stored in the buffer RAM 1930.

Figure 2:
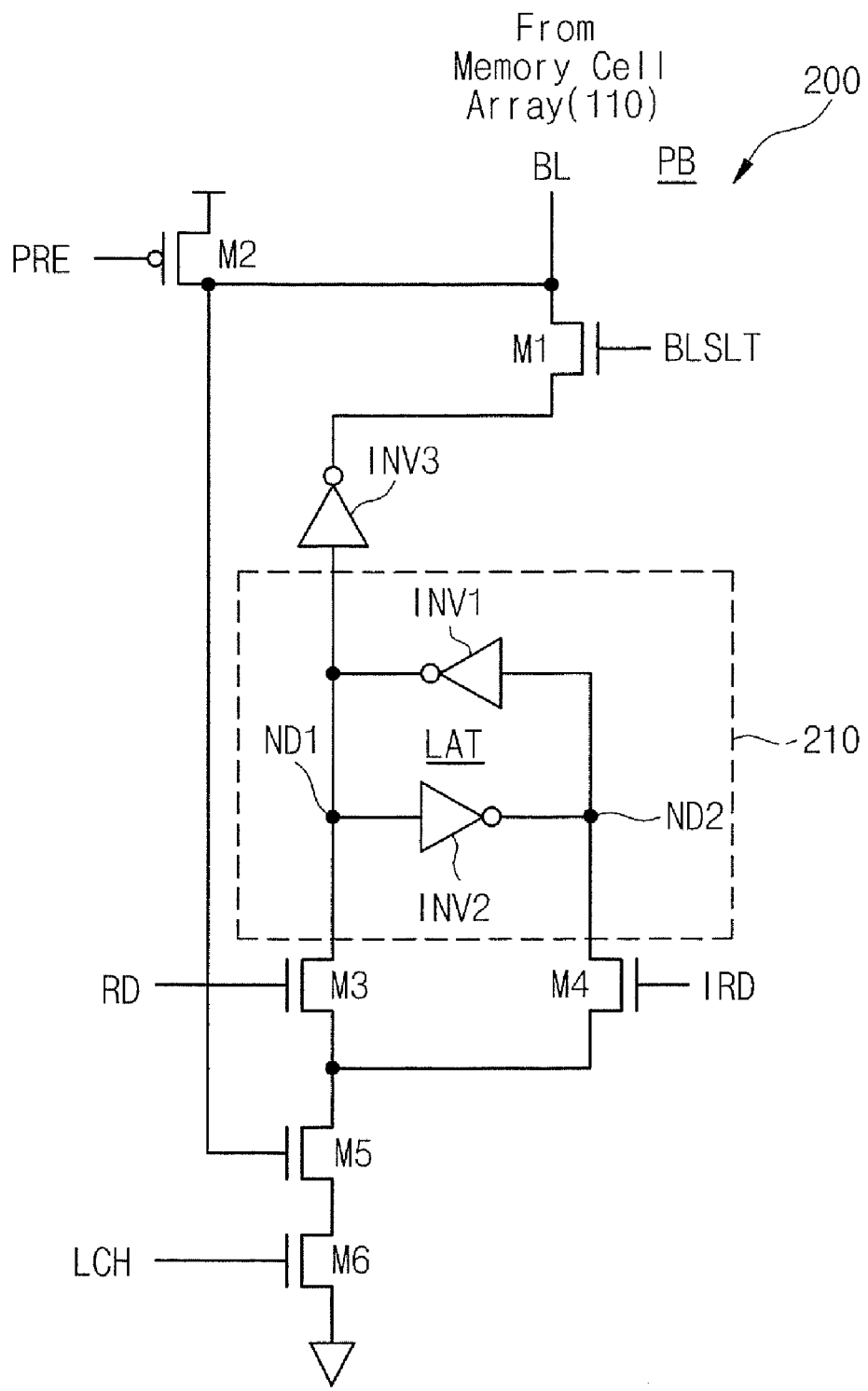
FIG. 2 is a schematic diagram of a page buffer according to some embodiments of the present invention.

Referring now to FIG. 2, a schematic block diagram of a page buffer according to some embodiments of the present invention will be discussed. As illustrated in FIG. 2, a page buffer 200 includes a PMOS transistor M2, first through fifth NMOS transistors M1 and M3 through M6 and three invertors INV1 through INV3 connected as shown in FIG. 2. The single latch structure 210 according to embodiments of the present invention includes first and second invertors INV1 and INV2 connected as shown. It will be understood that FIG. 2 illustrates a single page buffer cell. Memory devices according to embodiments of the present may include a plurality of these cells as illustrated in the page buffer 120 of FIG. 1. The page buffer operates responsive to a precharge signal PRE, data received from the memory cell array 110 (FIG. 1) on the bit line (BL), a bit line select signal (BLSLT), a read signal RD, an inverse read signal (IRD) and a latch signal (LCH). Circuits such as the page buffer of FIG. 2 are known to those having skill in the art and, therefore, details with respect to the operation thereof will be omitted herein in the interest of brevity.

Figure 3:
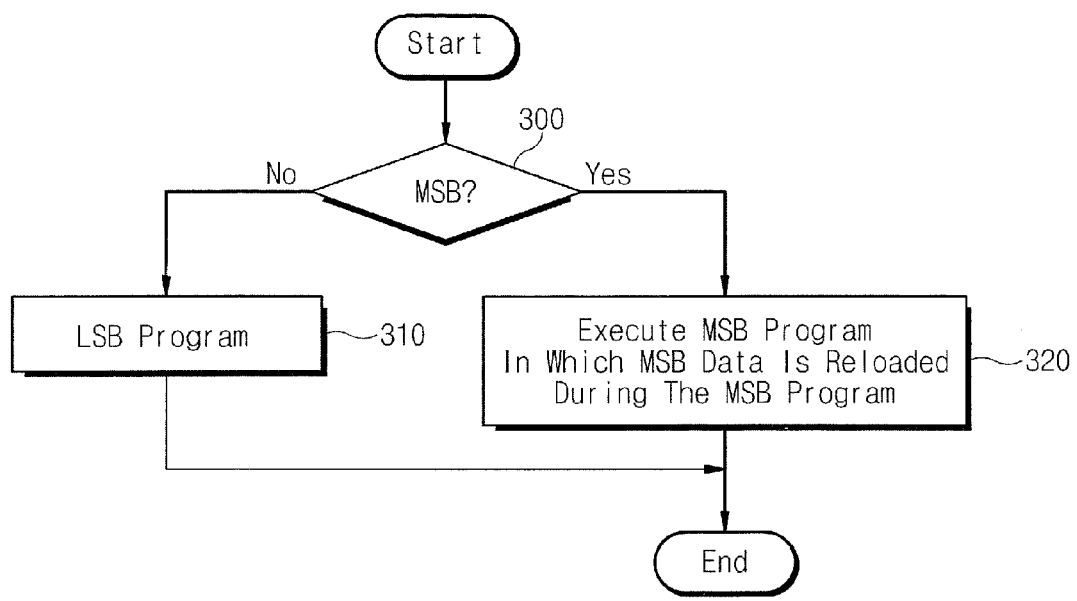
FIG. 3 is a flowchart illustrating operations of programming methods according to according to some embodiments of the present invention.

Referring now to FIGS. 3 through 7, operations according to some embodiments of the present invention will be discussed. Referring now to FIG. 3, a flowchart illustrating operations of programming methods (writing operations) to according to some embodiments of the present invention will be discussed. Methods of programming (writing operations) according to embodiments of the present invention are performed in a multi-bit non-volatile memory device including a memory cell array including a plurality of memory cells, a page buffer coupled to the memory cell array including a plurality of latches and a buffer RAM coupled to the page buffer as discussed above with respect to FIGS. 1 and 2.

As illustrated in FIG. 3, operations begin at block 300 by determining if an MSB is being programmed (written). If it is determined that an MSB is not being programmed (block 300), the LSB program is executed (block 310). If, on the other hand, it is determined that the MSB is being programmed (block 300), the MSB program is executed (block 320). It will be understood that executing of the MSB program (block 320), the data may be reloaded from the buffer RAM 130 (FIG. 1) to the page buffer 120 (FIG. 1).

Figure 4:
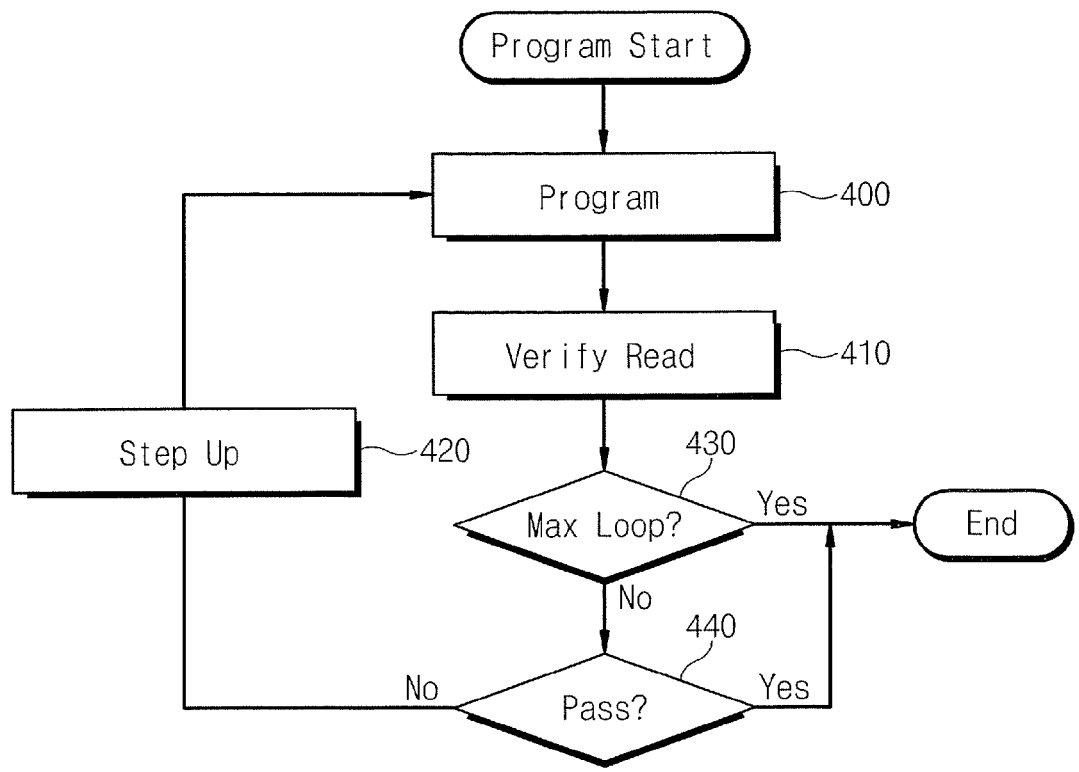
FIG. 4 is a flowchart illustrating operations of a least significant bit (LSB) program according to some embodiments of the present invention.

Operations of the LSB program according to some embodiments of the present invention will now be discussed with respect to FIGS. 4 and 6. As illustrated in FIG. 4, operations begin at block 400 by executing the LSB program. As illustrated in FIG. 6, the cell threshold voltage distribution begins at "11" 601 (the erase state). A verify read is performed using a read word line voltage (VR1) as shown in FIG. 4 (block 410). It is determined if the maximum number of iterations have been reached for the LSB program (block 430). If it is determined that the maximum number of iterations has been reached (block 430), operations of the LSB program terminate. If, on the other hand, it is determined that the maximum number of iterations has not been reached (block 430), it is determined if the cell threshold voltage distribution is "10" (602 of FIG. 6) (block 440). If it is determined that the cell threshold voltage distribution is "10" (block 440), the LSB program has passed and operations of the LSB program are terminated. If, on the other hand, it is determined that the cell threshold distribution is not "10" (block 440), the word line voltage is stepped up and operations of blocks 400 through 440 are repeated until either maximum number of iterations is reached (block 430) or the cell threshold voltage distribution "10" is reached (block 440) (block 420). In some embodiments of the present invention, the step up program (block 420) may be an incremental step pulse program (ISPP), however, embodiments of the present invention are not limited to this configuration.

In other words, as illustrated in the diagram illustrating an LSB program 600 of FIG. 6, the LSB program begins with a cell threshold distribution voltage "11" 601 (the erase state) and ends with a cell threshold distribution of "10" 602. As illustrated by the flowchart of FIG. 4, this transition may not happen in one programming step, it may take several programming iterations before the final state "10" is achieved, i.e., before the pass (block 440) is generated.

Figure 5:
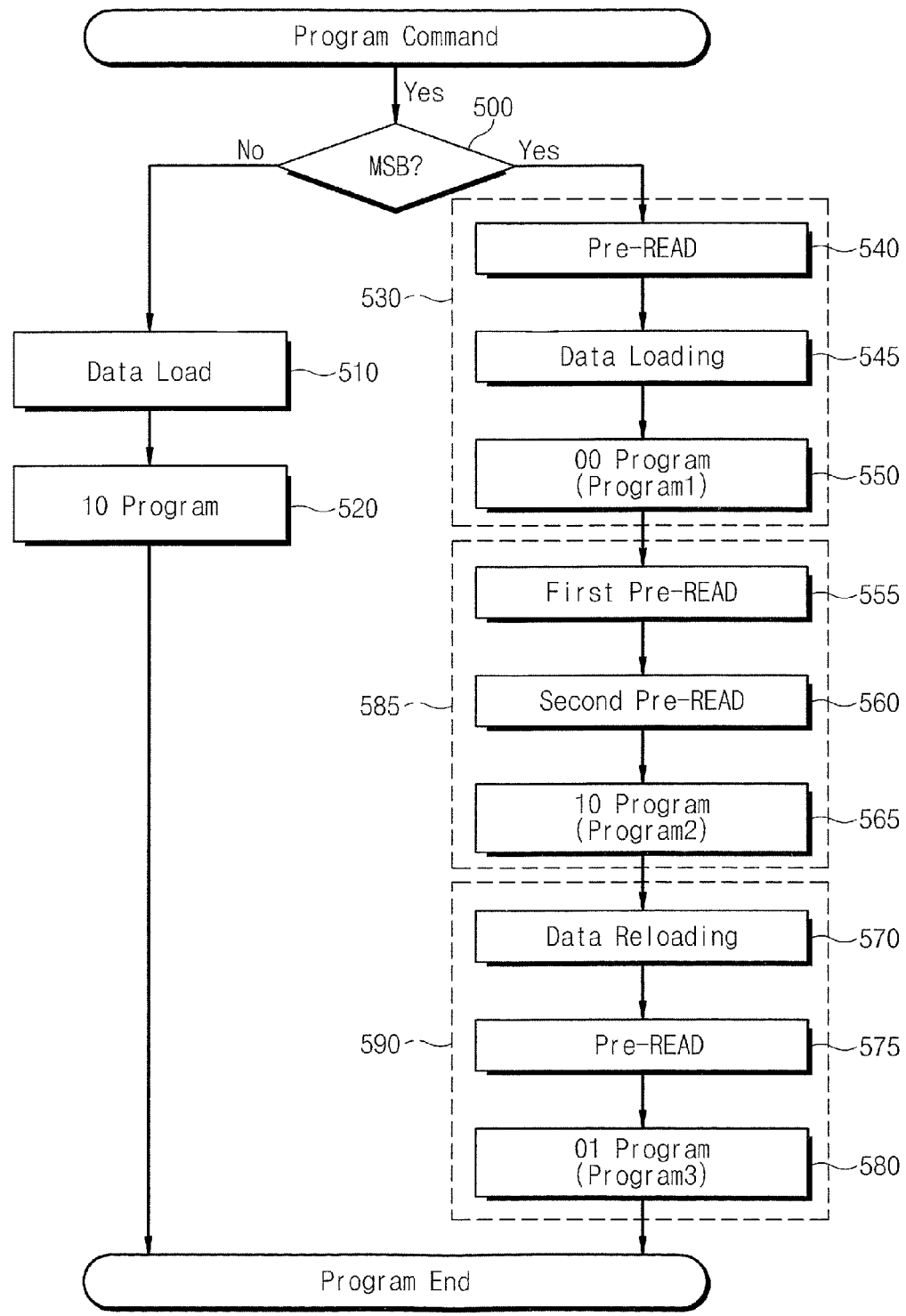
FIG. 5 is a flowchart illustrating operations of most significant bit (MSB) programs according to some embodiments of the present invention.

Operations of the MSB program according to some embodiments of the present invention will now be discussed with respect to FIGS. 5 and 7. Referring first to FIG. 5, a flowchart illustrating operations of most significant bit (MSB) programs according to some embodiments of the present invention will be discussed. As illustrated in FIG. 5, operations begin at block 500 by determining if the MSB is being programmed. If it is determined that the MSB is not being programmed (block 500), operations of blocks 510 and 520 are performed which correspond to the LSB program discussed above with respect to FIG. 4. If, on the other hand, it is determined that the MSB is being programmed (written into the memory cell array), operations proceed to block 540. The flowchart of FIG. 5 is divided into three sections. Blocks 540-550 represent the operations of the MSB "00" program (block 530), blocks 555-565 represent the operations of the MSB "10" program (block 585) and blocks 570-580 represent the operations of the MSB "01" program (block 590) according to some embodiments of the present invention.

Executing the MSB "00" program (block 530) includes pre-reading data (block 540) from the memory cell, loading data into the page buffer (block 545) and executing the "00" program (block 550). This is further illustrated in FIG. 7. As illustrated in FIG. 7, during the MSB "00" program 720 the cell threshold voltage distribution of "10" 702 and transitions to a cell threshold voltage distribution of "00" 703. Thus, cells 702 and 703 correspond to the loaded data "0".

Executing the "10" program (block 585) includes pre-reading a first time (block 555), pre-reading a second time (block 560) and executing a "10" program (block 565). This is further illustrated in FIG. 7. As illustrated in FIG. 7, during the MSB "10" program 730 the cell threshold voltage distribution of "10" 702 and transitions to a cell threshold voltage distribution of "10" 704. This particular program can be referred to as shadow programming and is discussed U.S. Pat. No. 5,751,634 (the '634 patent) entitled NON-VOLATILE SEMICONDUCTOR MEMORY DEVICE FOR STORING MULTIVALUE DATA AND READOUT/WRITE-IN METHOD THEREFOR to Itoh, the disclosure of which has been incorporated herein by reference as if set forth in its entirety. As further illustrated in FIG. 7, VR1 is less than Vth of the selected cells, which is less than VFY2.

The results of the MSB "00" and "10" programs produce intermediate program data. This intermediate data may be stored in the page buffer 120 (FIG. 1) as discussed above with respect to FIG. 1.

Executing the MSB "01" program (block 590) comprises reloading data, through the page buffer (block 570), a result of the MSB "10" program, pre-reading data (block 575) and executing the MSB "01" program (block 580). This is further illustrated in FIG. 7. As illustrated in FIG. 7, during the MSB "01" program 740 the cell threshold voltage distribution of "11" 701 and transitions to a cell threshold voltage distribution of "01" 705. The MSB data may be stored in the buffer RAM 130 as discussed above with respect to FIG. 1.

Referring now to FIGS. 8 through 11, which illustrate schematic diagrams illustrating operations of page buffers during various programming stages according to some embodiments of the present invention. It will be understood that the page buffers illustrated in FIGS. 8 through 11 are the same page buffer that is illustrated in FIG. 2, but includes additional information with respect to the various programming stages as will be discussed further herein. It will be understood that with respect to all of the page buffers illustrated in FIGS. 8 through 11, when the bit line (BL) is at a logic high state ("1"), programming of the selected memory cell is inhibited, i.e. no current is allowed to flow. When, on the other hand, the bit line (BL) is in a logic low state ("0"), current is allowed to flow to the memory cell and therefore allows data to be programmed into the memory cell associated with the BL. Furthermore, the read signal (RD) is always in a logic low state "0".

Figure 8:
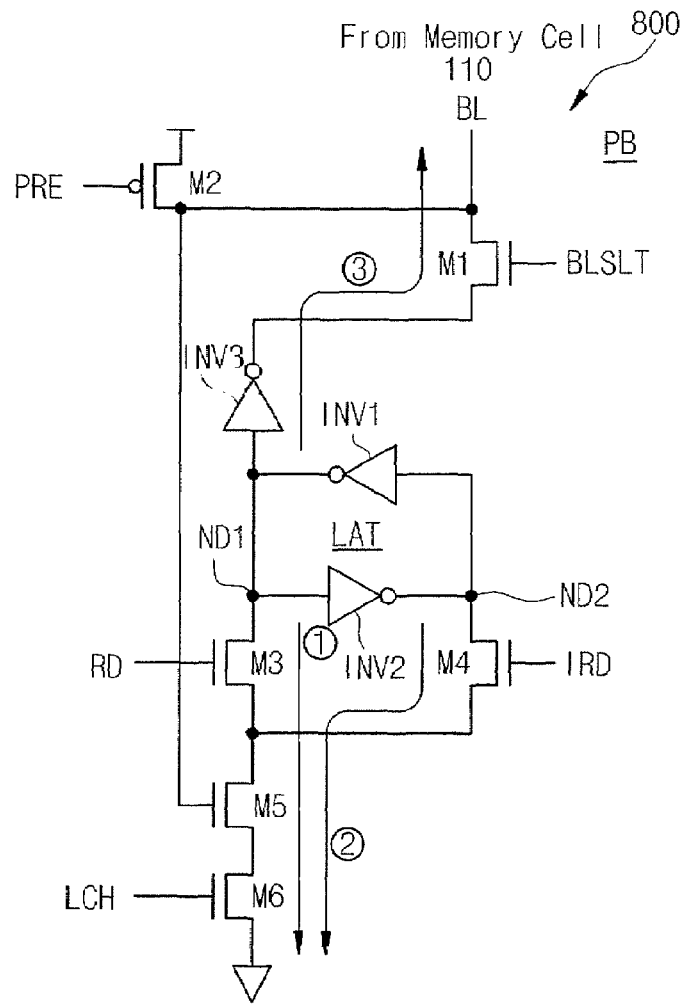
FIG. 8 is a schematic diagram illustrating operations of a page buffer during an LSB program according to some embodiments of the present invention.

Referring first to FIG. 8, a schematic diagram illustrating a page buffer during an LSB program according to some embodiments of the present invention will be discussed. As illustrated in FIG. 8, the path labeled (1) corresponds to a reset of the page buffer 800. The partial circuit 810 illustrated in FIG. 8 illustrates the values around the first through third invertors INV1 through INV3 during a reset operation.

The second path labeled (2) of the page buffer 800 corresponds to the data path. As illustrated by the partial circuits 815 and 820 which illustrate the values around the first through third invertors INV1 through INV3 during a programming operation, inverse read (IRD) is a logic high ("1") when the program data is "0" and a logic low ("0" or "L") when the program data is a "1". Finally, the third path labeled (3) of the page buffer 800 corresponds to the programming path that programs the memory cell in the memory cell array.

Figure 9:
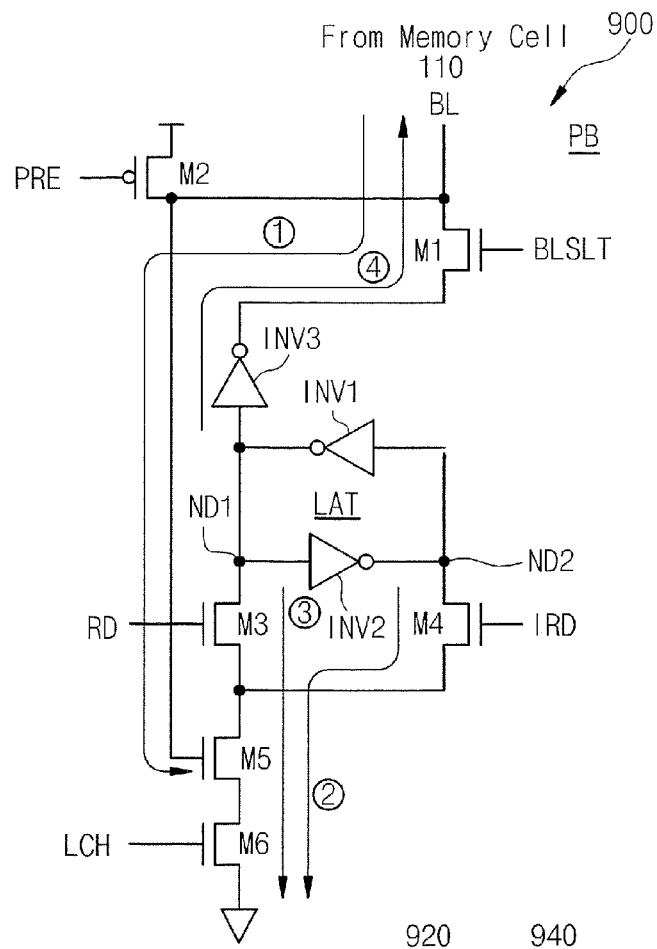
FIG. 9 is a schematic diagram illustrating operations of a page buffer during an MSB "00" program according to some embodiments of the present invention.

Referring now to FIG. 9, a schematic block diagram illustrating operations of a page buffer during an MSB "00" program according to some embodiments of the present invention will be discussed. As illustrated in FIG. 9, the path labeled (3) corresponds to a reset of the page buffer 800. The partial circuit 910 illustrated in FIG. 9 illustrates the values around the first through third invertors INV1 through INV3 during a reset operation.

The first path labeled (1) of the page buffer 900 corresponds to the pre-read of the memory cell before the data is loaded. The partial circuits 920 and 930 in FIG. 9 illustrate the alternative values around the first through third invertors INV1 through INV3 during a pre-read operation.

The second path labeled (2) of the page buffer 900 corresponds to the data path. As illustrated by the partial circuits 940, 950 and 955 which illustrate the values around the first through third invertors INV1 through INV3 during a programming operation, inverse read (IRD) is a logic high ("1") when the program data is "0" and a logic low ("0" or "L") when the program data is a "1". Finally, the fourth path labeled (4) of the page buffer 900 corresponds to the current path that programs the memory cell in the memory cell array.

Referring now to FIG. 10, a schematic block diagram illustrating operations of a page buffer during an MSB "10" program according to some embodiments of the present invention will be discussed. As illustrated in FIG. 10, the path labeled (4) corresponds to a reset of the page buffer 1000. The partial circuit 1010 illustrated in FIG. 10 illustrates the values around the first through third invertors INV1 through INV3 during a reset operation.

The first path labeled (1) and the second path labeled (2) of the page buffer 1000 corresponds to the first pre-read of the memory cell. The partial circuits 1020 in FIG. 10 illustrate the alternative values around the first through third invertors INV1 through INV3 during the first pre-read operation. The third path labeled (3) and the fourth path labeled (4) of the page buffer 1000 corresponds to the second pre-read of the memory cell. The partial circuits 1030 in FIG. 10 illustrate the alternative values around the first through third invertors INV1 through INV3 during the first pre-read operation.

The MSB "10" program does not include a data read because the data is shadow programmed as discussed above. Finally, the fifth path labeled (5) of the page buffer 1000 corresponds to the current path that programs the memory cell in the memory cell array.

Figure 11:
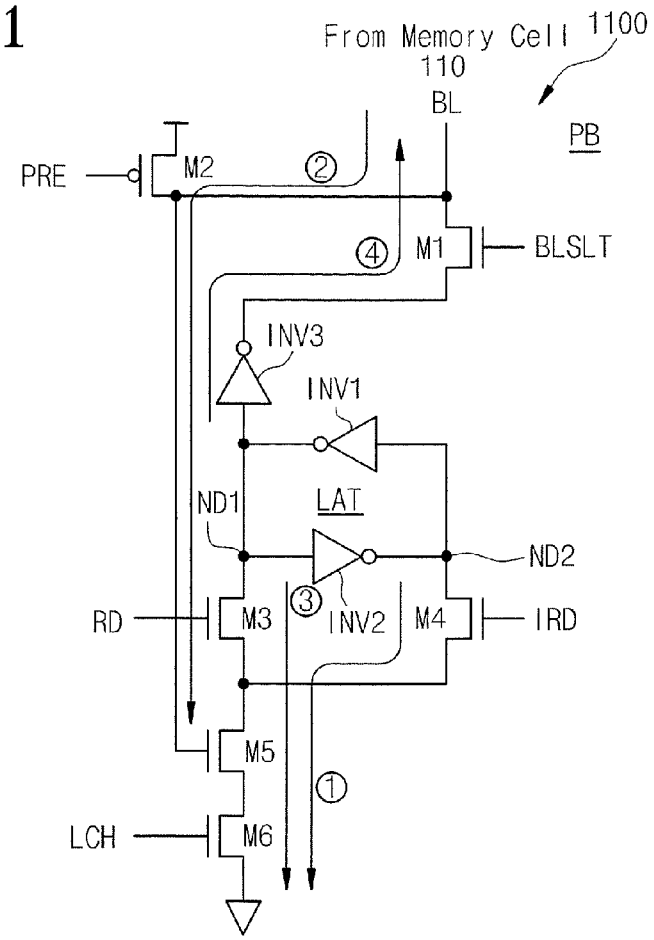
FIG. 11 is a schematic diagram illustrating operations of a page buffer during an MSB "01" program according to some embodiments of the present invention.

Referring now to FIG. 11, a schematic block diagram illustrating operations of a page buffer during an MSB "01" program according to some embodiments of the present invention will be discussed. As illustrated in FIG. 11, the path labeled (3) corresponds to a reset of the page buffer 1100. The partial circuit 1110 illustrated in FIG. 11 illustrates the values around the first through third invertors INV1 through INV3 during a reset operation.

The first path labeled (1) illustrates the data reload from the buffer RAM according to some embodiments of the present invention. The partial circuits 1120 in FIG. 11 illustrate the alternative values around the first through third invertors INV1 through INV3 during the data reload operation. The second path labeled (2) and the third path labeled (3) of the page buffer 1100 correspond to the pre-read of the memory cell. The partial circuits 1130 in FIG. 11 illustrate the alternative values around the first through third invertors INV1 through INV3 during the pre-read operation. Finally, the fourth path labeled (4) of the page buffer 1100 corresponds to the current path that programs the memory cell in the memory cell array.

Figure 13:
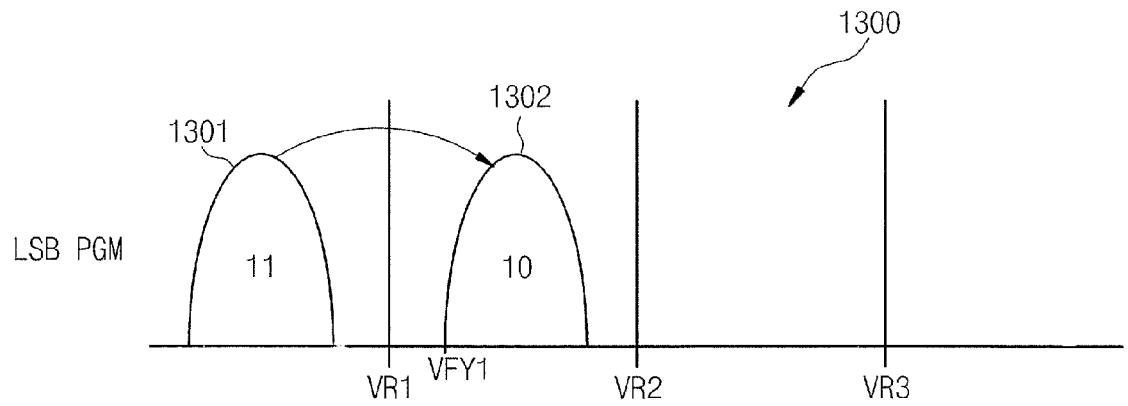
FIG. 13 is a diagram illustrating an LSB program according to some embodiments of the present invention.
Figure 14:
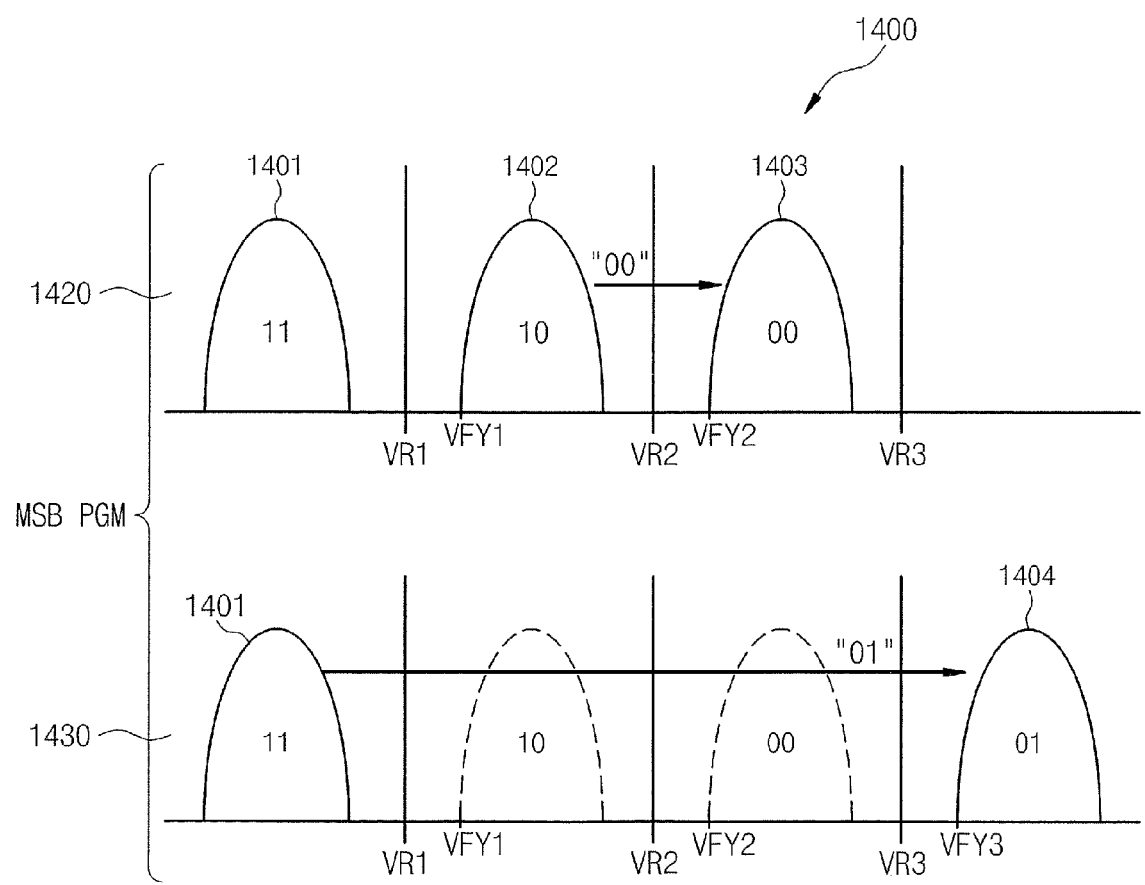
FIG. 14 is a diagram illustrating an MSB program according to some embodiments of the present invention.

Operations according to further embodiments of the present invention will now be discussed with respect to the flowchart of FIG. 12 and the diagrams of FIGS. 13 and 14. FIG. 13 is a diagram illustrating an LSB program according to some embodiments of the present invention and FIG. 14 is a diagram illustrating an MSB program according to some embodiments of the present invention.

Figure 12:
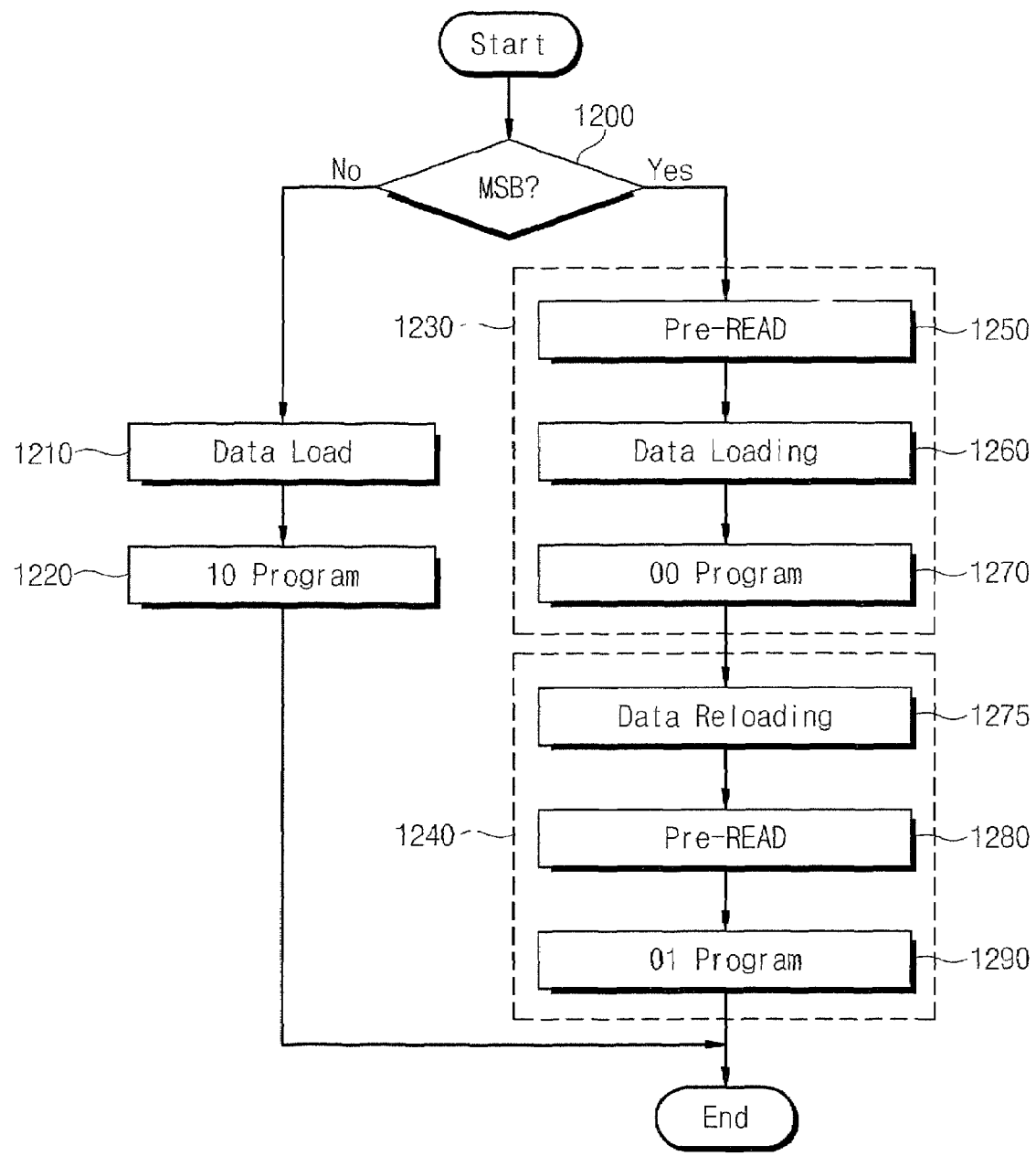
FIG. 12 is a flowchart illustrating operations of programming methods according to some embodiments of the present invention.

Referring first to FIG. 12, operations begin at block 1200 by determining if the MSB is being programmed. If it is determined that the MSB is not being programmed (block 1200), operations of blocks 1210 and 1220 are performed which correspond to the LSB program. In particular, data is loaded (block 1210) and the LSB ("10") program is executed (block 1220). In particular, referring to FIG. 13, as illustrated in the diagram illustrating an LSB program 1300, the LSB program begins with a cell threshold voltage distribution "11" 1301 (the erase state) and ends with a cell threshold distribution of "10" 1302.

If, on the other hand, it is determined that the MSB is being programmed (written into the memory cell array)(block 1200), operations proceed to block 1250. The flowchart of FIG. 12 is divided into two sections. Blocks 1250-1270 represent the operations of the MSB "00" program (block 1230) and blocks 1275-1290 represent the operations of the MSB "01" program (block 1230) according to some embodiments of the present invention.

Executing the MSB "00" program (block 1230) includes pre-reading data from the memory cell (block 1250), loading data into the page buffer (block 1260) and executing the "00" program (block 1270). This is further illustrated in FIG. 14. As illustrated in FIG. 14, during the MSB "00" program 1420 the cell threshold voltage distribution of "10" 1402 transitions to a cell threshold voltage distribution of "00" 1403. Thus, cells 1402 and 1403 correspond to the loaded data "0".

Executing the MSB "01" program (block 1240) comprises reloading data, through the page buffer (block 1275), pre-reading data (block 1280) and executing the MSB "01" program (block 580). This is further illustrated in FIG. 14. As illustrated in FIG. 14, during the MSB "01" program 1430 the cell threshold voltage distribution of "11" 1401 transitions to a cell threshold voltage distribution of "01" 1404. The MSB data may be stored in the buffer RAM 130 as discussed above with respect to FIG. 1.

Figure 16:
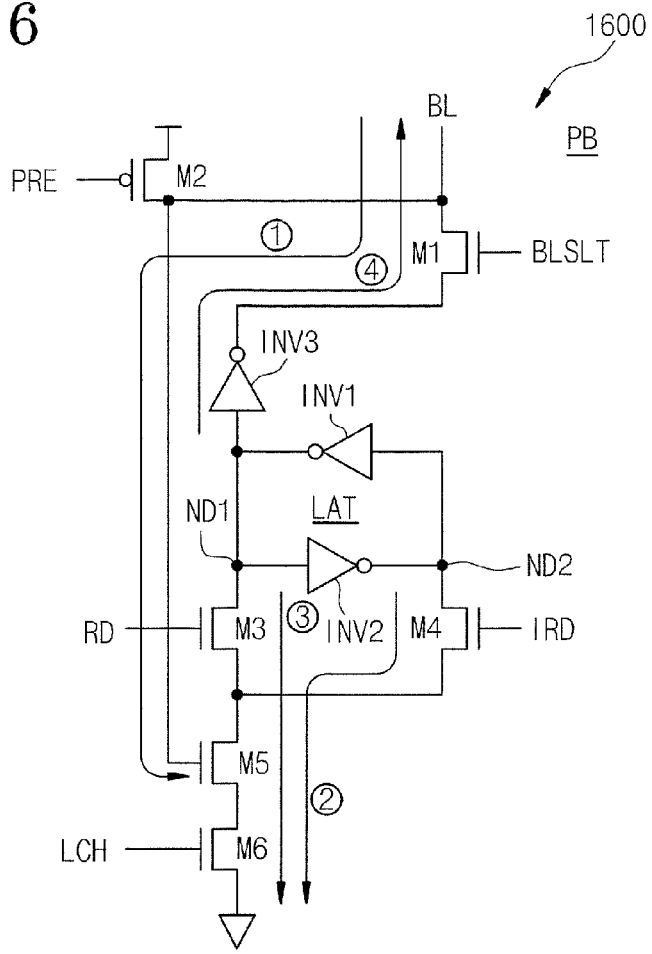
FIG. 16 is a schematic diagram illustrating page buffer operations during an MSB "00" program according to some embodiments of the present invention.
Figure 17:
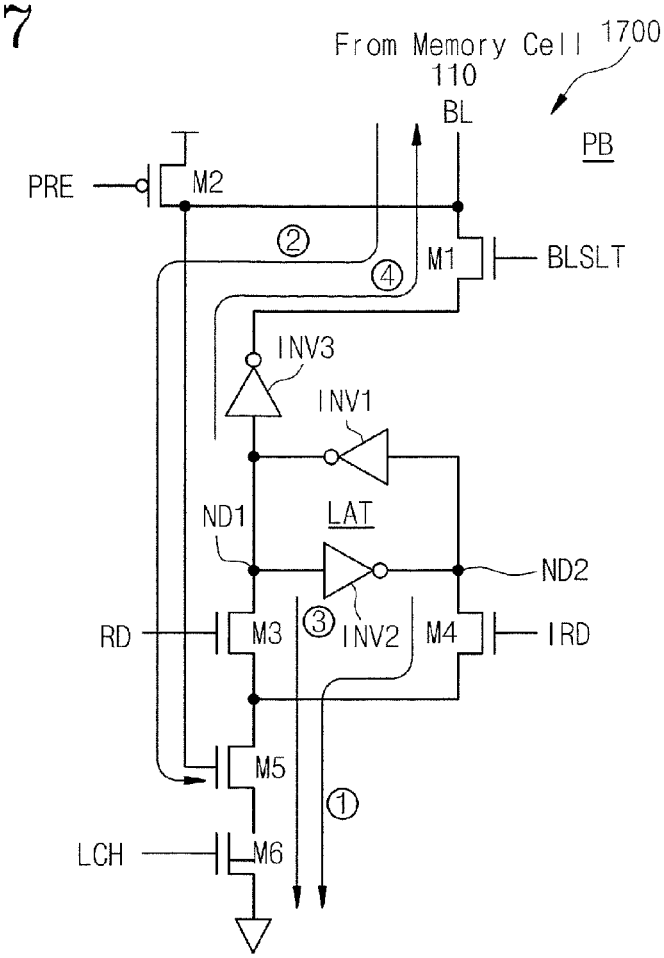
FIG. 17 is a schematic diagram illustrating page buffer operations during an MSB "01" program according to some embodiments of the present invention.

Referring now to FIGS. 15 through 17, which illustrate schematic diagrams illustrating operations of page buffers during various programming stages. It will be understood that the page buffers illustrated in FIGS. 8 through 11 are the same page buffer that is illustrated in FIG. 2, but includes additional information with respect to the various programming stages as will be discussed further herein. It will be understood that with respect to all of the page buffers illustrated in FIGS. 8 through 11, when the bit line (BL) is at a logic high state ("1"), programming of the selected memory cell is inhibited, i.e. no current is allowed to flow. When, on the other hand, the bit line (BL) is in a logic low state ("0"), current is allowed to flow to the memory cell and therefore allows data to be programmed into the memory cell associated with the BL. Furthermore, the read signal (RD) is always in a logic low state "0".

Referring first to FIG. 15, a schematic diagram illustrating a page buffer during an LSB program according to some embodiments of the present invention will be discussed. As illustrated in FIG. 15, the path labeled (1) corresponds to a reset of the page buffer 1500. The partial circuit 1510 illustrated in FIG. 15 illustrates the values around the first through third invertors INV1 through INV3 during a reset operation.

The second path labeled (2) of the page buffer 1500 corresponds to the data path. As illustrated by the partial circuit 1520 which illustrate the values around the first through third invertors INV1 through INV3 during a programming operation, inverse read (IRD) is a logic high ("1") when the program data is "0" and a logic low ("0" or "L") when the program data is a "1". Finally, the third path labeled (3) of the page buffer 1500 corresponds to the programming path that programs the memory cell in the memory cell array.

Referring now to FIG. 16, a schematic block diagram illustrating operations of a page buffer during an MSB "00" program according to some embodiments of the present invention will be discussed. As illustrated in FIG. 16, the path labeled (3) corresponds to a reset of the page buffer 1600. The partial circuit 1610 illustrated in FIG. 16 illustrates the values around the first through third invertors INV1 through INV3 during a reset operation.

The first path labeled (1) and the second path labeled (2) of the page buffer 1600 corresponds to the pre-read of the memory cell before the data is loaded. The partial circuits 1620 in FIG. 16 illustrate the alternative values around the first through third invertors INV1 through INV3 during a pre-read operation.

The third path labeled (3) of the page buffer 1600 corresponds to the data path. As illustrated by the partial circuits 160, which illustrate the values around the first through third invertors INV1 through INV3 during a programming operation, inverse read (IRD) is a logic high ("1") when the program data is "0" and a logic low ("0" or "L") when the program data is a "1". Finally, the fourth path labeled (4) of the page buffer 1600 corresponds to the current path that programs the memory cell in the memory cell array.

Referring now to FIG. 17, a schematic block diagram illustrating operations of a page buffer during an MSB "01" program according to some embodiments of the present invention will be discussed. As illustrated in FIG. 17, the path labeled (3) corresponds to a reset of the page buffer 1700. The partial circuit 1710 illustrated in FIG. 17 illustrates the values around the first through third invertors INV1 through INV3 during a reset operation.

The first path labeled (1) illustrates the data reload from the buffer RAM according to some embodiments of the present invention. The partial circuits 1720 in FIG. 17 illustrate the alternative values around the first through third invertors INV1 through INV3 during the data reload operation. The second path labeled (2) and the fourth path labeled (4) of the page buffer 1700 correspond to the pre-read of the memory cell. The partial circuits 1730 in FIG. 17 illustrate the alternative values around the first through third invertors INV1 through INV3 during the pre-read operation. Finally, the fourth path labeled (4) of the page buffer 1700 corresponds to the current path that programs the memory cell in the memory cell array.

Figure 18:
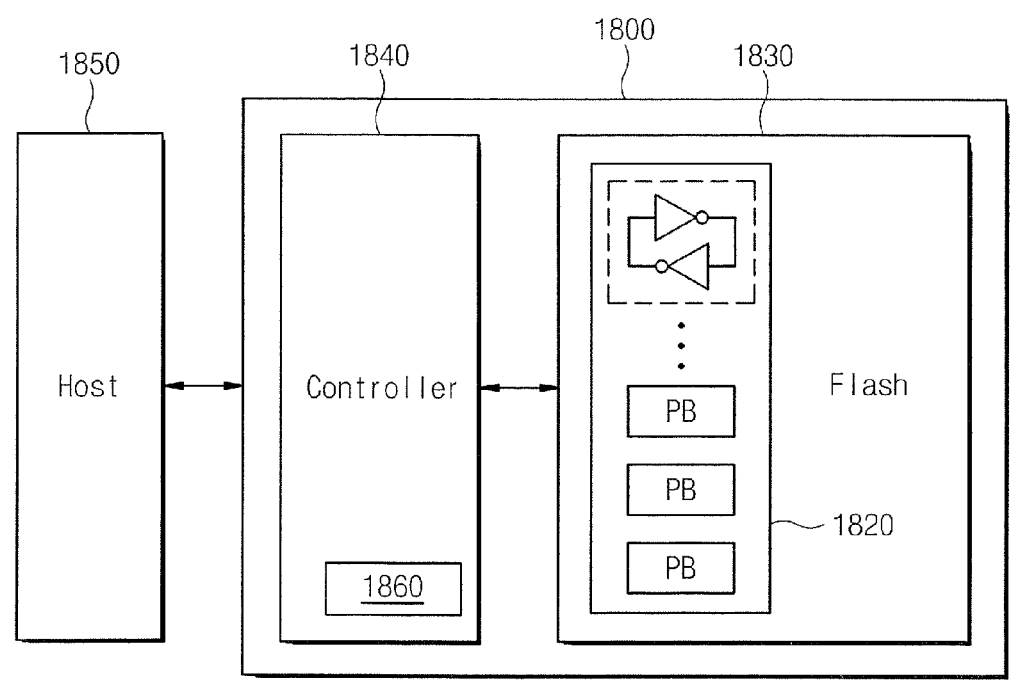
FIG. 18 is a block diagram illustrating a flash memory device according to some embodiments of the present invention.

Referring now to FIG. 18, a block diagram illustrating a flash memory device according to some embodiments of the present invention will be discussed. In particular, FIG. 18 illustrates a flash memory card 1800 coupled to an external host device 1850. The host 1850 interfaces with the memory card 1800. The host 1850 may be, for example, a computer, PDA, camera, PSP, PMP, mobile phone and the like, without departing from the scope of the present invention.

The memory card 1800 includes a controller 1840 and a NAND flash memory 1830. As illustrated in FIG. 18, the controller can include the buffer RAM 1860 according to embodiments of the present invention. The NAND flash memory includes a single latch page buffer 1820 according to some embodiments of the present invention. The details of the page buffer 1820 and the buffer RAM 1860 were discussed above and will not be repeated herein in the interest of brevity.

Referring now to FIG. 19, a multi-bit flash memory system according to some embodiments of the present invention will be discussed. The flash memory of FIG. 19 is similar to the flash memory of FIG. 1, except the page buffer 1920 is a three-bit page buffer. Thus, first through third bits of multi-bit data is stored in the page buffer 1920 and the fourth bit of multi-bit data is stored in the buffer RAM 1930.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

That which is claimed is:

1. A non-volatile memory device comprising:
   a memory cell array including a plurality of memory cells, each of which is able to store at least two bit data;
   a page buffer electrically coupled to the memory cell array, the page buffer including a plurality of latches configured to store a first bit of multi-bit data to be written into one of the plurality of memory cells of the memory cell array; and
   a buffer random access memory (RAM) electrically coupled to the page buffer, the buffer RAM being configured to store a second bit of the multi-bit data to be written into one of the plurality of memory cells of the memory cell array.

2. The memory device of claim 1:
   wherein the page buffer includes a plurality of single latches, each of the single latches being configured to store a least significant bit (LSB) of the multi-bit data; and
   wherein the buffer RAM is configured to store a most significant bit (MSB) of the multi-bit data.

3. The memory device of claim 1, wherein the page buffer includes a plurality of single latches being configured to store intermediate program data.

4. The memory device of claim 3, wherein the intermediate program data comprises most significant bit (MSB) intermediate program data and wherein final MSB data is stored in the buffer RAM.

5. The memory device of claim 1:
   wherein each of the plurality of memory cells is able to store at least 3 bit data;
   wherein the page buffer is further configured to store intermediate program data based on first and second bits from a least significant bit (LSB) of the at least 3 bit data; and
   wherein the buffer RAM is further configured to store a most significant bit (MSB) of the at least 3 bit data.

6. The memory device of claim 1, wherein the first and second bits of the multi-bit data are loaded into one of the plurality of the latches to form a program data, and the program data are written into one of the plurality of memory cells to program the second bit.

7. The memory device of claim 1, wherein an interface between the memory device and an external device comprises a NOR interface.

8. The memory device of claim 7, wherein the memory cell array comprises a NAND cell array.

9. The memory device of claim 1, wherein the buffer RAM is configured to reload the second bit of the multi-bit data into one of the plurality of memory cells through the page buffer.

10. A system, comprising:
    a controller including a buffer random access memory (RAM);
    a non-volatile memory device electrically coupled to the controller, the non-volatile memory device comprising:
      a memory cell array including a plurality of memory cells, each of which is able to store at least two bit data; and
      a page buffer electrically coupled to the memory cell array, the page buffer including a plurality of latches configured to store a first bit of multi-bit data to be written into one of the plurality of memory cells of the memory cell array responsive to a write command,
    wherein the buffer RAM is configured to store a second bit of multi-bit data to be written into one of the plurality of memory cells of the memory cell array responsive to the write command.

11. The system of claim 10, wherein the plurality of latches are further configured to store intermediate program data.

12. The system of claim 11, wherein the second bit of multi-bit data comprises a most significant bit (MSB) of multi-bit data and wherein the intermediate program data comprises MSB intermediate program data and wherein MSB data is stored in the buffer RAM.

13. The system of claim 10:
    wherein each of the plurality of memory cells is able to store at least 3 bit data;
    wherein the page buffer is further configured to store intermediate program data based on first and second bits from a least significant bit (LSB) of the at least 3 bit data; and
    wherein the buffer RAM is further configured to store a most significant bit (MSB) of the at least 3 bit data.

14. The system of claim 10, wherein the first and second bits of the multi-bit data are loaded into one of the plurality of the latches to form a program data, and the program data are written into one of the plurality of memory cells to program the second bit.

15. The system of claim 10, wherein the system further comprises an external device and wherein an interface between the memory device and the external device comprises a NOR interface.

16. The system of claim 15, wherein the memory cell array comprises NAND cell array.

17. The system of claim 10, wherein the buffer RAM is configured to reload the second bit of multi-bit data into one of the plurality of memory cells through the page buffer.

18. A flash memory card comprising:
a controller including a buffer random access memory (RAM); and
a non-volatile memory device electrically coupled to the controller, the non-volatile memory device comprising:
   a memory cell array including a plurality of memory cells, each of which is able to store at least two bit data; and
   a page buffer electrically coupled to the memory cell array, the page buffer including a plurality of latches configured to store a first bit of multi-bit data to be written into one of the plurality of memory cells of the memory cell array responsive to a write command,
   wherein the buffer RAM is configured to store a second bit of the multi-bit data to be written into one of the plurality of memory cells of the memory cell array responsive to the write command.

19. The memory card of claim 18, wherein the plurality of latches are further configured to store intermediate program data.

20. The memory card of claim 19, wherein the second bit of multi-bit data comprises a most significant bit (MSB) of multi-bit data wherein the intermediate program data comprises MSB intermediate program data and wherein MSB data is stored in the buffer RAM.

21. The memory card of claim 18:
wherein each of the plurality of memory cells being able to store at least 3 bit data;
wherein the page buffer is further configured to store intermediate program data based on first and second bits from a least significant bit (LSB) of the at least 3 bit data; and
wherein the buffer RAM is further configured to store a most significant bit (MSB) of the at least 3 bit data.

22. The memory card of claim 18, wherein the buffer RAM is configured to reload the second bit of the multi-bit data into one of the plurality of memory cells through the page buffer.

23. A method of programming a non-volatile memory device, the non-volatile memory device including a memory cell array including a plurality of memory cells, a page buffer coupled to the memory cell array including a plurality of latches and a buffer random access memory (RAM) coupled to the page buffer, the method comprising:
storing a first bit of multi-bit data in one of the plurality of latches of the page buffer;
storing a second bit of the multi-bit data in the buffer RAM;
loading the first bit of multi-bit data from the latch of the page buffer to into one of the plurality of memory cells in the memory cell array; and
reloading, through the page buffer, the second bit of multi-bit data from the buffer RAM into one of the plurality of memory cells in the memory cell array.

24. The method of claim 23, wherein the first bit comprises a least significant bit (LSB) of multi-bit data, wherein the second bit comprises a most significant bit of multi-bit data and wherein storing the LSB is preceded by:
determining if the MSB is being programmed into the non-volatile memory device;
executing an LSB program if it is determined that the MSB is not being programmed; and
executing the MSB program if it is determined that the MSB is being programmed.

25. The method of claim 24, wherein executing the LSB program comprises:
generating a verify read signal responsive to LSB program execution;
determining if a predetermined program level has been reached; and
repeating the generating and determining steps until the predetermined program level has been reached.

26. The method of claim 24, wherein executing the MSB program comprises:
executing an MSB "00" program;
executing an MSB "10" program; and
executing an MSB "01" program.

27. The method of claim 26:
wherein executing the MSB "00" program comprises pre-reading data,
loading data and executing the "00" program;
wherein executing the MSB "10" program comprises pre-reading data a first time, pre-reading data a second time and executing a "10" program; and
wherein executing the 01 program comprises reloading data, through the page buffer, a result of the MSB 10 program, pre-reading data and executing the MSB "01" program.

28. The method of claim 24, wherein executing the MSB program comprises:
executing an MSB "00" program; and
executing an MSB "01" program.

29. The method of claim 28:
wherein executing the MSB "00" program comprises pre-reading the LSB,
loading the LSB and executing the "00" program; and
wherein executing the 01 program comprises reloading, through the page buffer, a result of the MSB "10" program, pre-reading and executing the MSB "01" program.

30. The method of claim 24, wherein the reloading the second bit of multi-bit data comprises:
loading the first and second bits into one of the plurality of latches to form a program data; and
writing the program data into one of the plurality of memory cells.

* * * * *